United States Patent [19]
Lawton

[11] 3,987,425
[45] Oct. 19, 1976

[54] LEAKAGE RESISTANCE DETECTOR AND ALARM CIRCUIT

[75] Inventor: Richard A. Lawton, Don Mills, Canada

[73] Assignee: Electronic Surveillance Corporation, Willowdale

[22] Filed: Dec. 5, 1975

[21] Appl. No.: 637,894

Related U.S. Application Data

[63] Continuation-in-part of Ser. No. 427,018, Dec. 13, 1973, abandoned.

[52] U.S. Cl. .............................. 340/253 R; 340/255
[51] Int. Cl.[2] ....................................... G08B 21/00
[58] Field of Search .................. 340/248, 255, 253; 324/54; 317/18 A

[56] References Cited
UNITED STATES PATENTS

| | | | |
|---|---|---|---|
| 1,394,642 | 10/1921 | Quass | 340/248 R |
| 2,658,191 | 11/1953 | Stolp | 340/248 C |
| 2,727,203 | 12/1955 | Zeitlin et al. | 340/237.5 X |
| 3,383,522 | 5/1968 | Apfelbeck et al. | 340/248 B UX |

Primary Examiner—John W. Caldwell
Assistant Examiner—Daniel Myer

[57] ABSTRACT

The circuit is adaptable for electric apparatus, particularly trolley buses and the like, where the apparatus derives its power from a pair of electric power lines, and the body of the apparatus is insulated from ground. One of the pair of electric power lines is at, or very nearly at, ground potential. The circuit provides a known test resistance interposed between the body of the apparatus and the most negative of the power lines so that the test resistance is effectively in series with the leakage resistance between the electric power lines; thereby permitting a measurement between the body of the apparatus and the most negative of the power lines to determine current flow through the known resistance greater than a predetermined minimum. When the current flow through the known resistance is higher than the predetermined minimum, the body of the apparatus is at a voltage above ground sufficient that a hazardous condition might exist, and an alarm status is initiated. The alarm circuits include a first delay circuit to accommodate transient voltage swings between the power lines which would normally be shorter than a predetermined period of time; and a second delay circuit having a longer predetermined period of time so that if an alarm status continues for the second predetermined length of time, an alarm indication is latched on.

5 Claims, 3 Drawing Figures

LEAKAGE RESISTANCE DETECTOR AND ALARM CIRCUIT

This application is a continuation-in-part of U.S. patent application Ser. No. 427,018 filed Dec. 13, 1973 which has been abandoned.

FIELD OF THE INVENTION

This invention relates to a detector and alarm circuit for use with electric apparatus which is connected to power lines and where the body of the apparatus is insulated from ground. More particularly, this invention provides a detector and alarm circuit for electrically powered, mobile apparatus such as trolley buses and the like, for determining incipient leakage resistance between the body of the apparatus and the power lines such that, when the body is insulated from ground and one of the power lines is substantially at ground potential, a voltage occurs on the body of the apparatus which might be hazardous to any human who might come into contact with it.

BACKGROUND OF THE INVENTION

There are many types of apparatus which derive power from a pair of electric power lines, and which are substantially insulated from ground. Particularly, however, there is a class of vehicle which derives its power from overhead lines, where the chassis or body of the vehicle is insulated from ground because it runs on rubber tires or the like, and which may have extremely high exposure to the general public. Such vehicles may be trolley coaches or buses which have a pair of trolley poles, each of which contacts one of a pair of overhead lines from which the electric power to drive the motors of the coach or bus is derived. Other types of vehicles maybe certain subway trains which run on rubber tires, and certain types of mine equipment.

In such apparatus as a trolley coach, it is usual that the motor of the coach is well insulated, but because of their nature and the circuits in which they operate, the speed control devices which are manipulated by the operator or driver of the vehicle may have leakage resistance.

In a trolley system, there are usually just two trolley lines from which power is derived, and they are normally DC. However, the general circuits of this invention may be adapted for AC operation, as discussed in greater detail hereafter. In any event, at any one time and in any one section of line, one of the pair of trolley lines is substantially at ground potential or within very few volts of ground potential because of the current flow through that line and the finite resistance thereof. Nonetheless, for all purposes, one line might be considered to be a zero voltage (OV) line, and the other line might be considered to be a high voltage (HV) line. Trolley lines are not polarized — that is, the left line is not always, say, the OV line and the right line the HV line — so that the apparatus of this invention must be able to operate, regardless of which of the two trolley lines is the OV line and which is the HV line.

When leakage resistance occurs, it will appear between the chassis or body of the apparatus such as a trolley coach and the HV trolley line, no matter which is the HV line at any given instant in time, because of the circuit arrangements within the trolley coach. However, as the leakage resistance reduces, a higher current flows through it, and the voltage of the chassis or body of the trolley coach or other apparatus tends to float upwards away from ground potential, or the potential of the OV line. As noted, apparatus particularly such as trolley coaches may have very high exposure to the public, and it is important that there should be no chance of any person being shocked by coming into contact with the body or other portion of such apparatus while that person's body is at ground potential. Thus, certain limits are set for the voltage of the body or other portion of an apparatus which might be contacted by a human who is at ground potential, without hazard to that human; and of current which, when contacted at sufficiently high voltage by a human is made, would be hazardous to that human. The normal limits, particularly for DC operation, are 30 volts and 2 milliamps. The 30 volt limit is chosen because it, together with the few volts that the OV line might swing above ground potential are in total below the threshold voltage which a person having high sensivity might notice. The 2 ma. level is chosen because current above that level through the body of a person may be harmful to that person.

Thus, by interposing a known resistance between the body or other portion of the electric powered apparatus and the most negative of the lines from which it derives its power, in series with an incipient leakage resistance between the body or other portion of the apparatus and the most positive of the electric power lines, and by providing means for detecting the flow of current through the known resistance and for causing an alarm status to be indicated when the flow of current through that known resistance exceeds a predetermined value and thus when the voltage drop across the known resistance exceeds a predetermined amount, an apparatus is provided which will warn of leakage resistance which is or which may become hazardous. When an alarm status occurs but lasts for only a very short period of time, it may be helpful to inhibit an alarm signal for a short period of time so as to accommodate voltage swings due to start-up, or roll-through at junction insulators, etc. If a somewhat longer alarm status occurs, it may be helpful to provide one form of alarm indication; but if the alarm status lasts for a period of time such that real danger might exist, a different form of alarm signal might be given. Such alarm inhibition and delay circuits are provided by this invention.

Because of the circuit arrangement discussed in greater detail hereafter, the detector and alarm circuit provided by this invention may be adapted to AC operation as well as DC operation, for use in other types of operations such as mine or underwater electrically operated devices which are insulated from ground, but which derive their power from at least a pair of lines of which one is nominally or substantially at ground potential and where leakage resistance from the body of the apparatus to the higher voltage line may occur such that the potential on the body of the apparatus with respect to ground might rise to such a level as to be potentially hazardous.

Apparatus according to the present invention is usually adapted to be operated from an independent voltage source within the trolley coach or other apparatus in which incipient leakage resistance is intended to be detected. Such independent voltage sources usually comprise batteries of the lead-acid automotive type which are used for lighting and standby purposes, etc., and which are usually of quite low DC voltage.

BRIEF SUMMARY OF THE INVENTION

It is an object of this invention to provide detector and alarm circuit apparatus for trolley coaches and the like for detecting incipient leakage resistance from the chassis or body of the trolley coach or like apparatus to the most positive of a pair of electric power lines from which power to drive the trolley coach or the like is derived, so as to give an alarm indication under predetermined conditions.

Another object of this invention is to provide apparatus of the sort referred to above where delay circuitry may be included in the alarm circuits to inhibit alarm indication due to transient conditions.

Yet another object of this invention is to provide apparatus of the sort referred to above, where the circuits of the apparatus may be easily and inexpensively assembled using standard, off-the-shelf components.

A still further object of this invention is to provide a detector and alarm circuit for detecting incipient leakage resistance conditions in apparatus which is insulated from ground but where one of the electric power lines from which the apparatus derives its power is substantially at ground potential; and where the circuits are operative regardless of which of the electric power lines to which the apparatus is connected is the most positive and which is the most negative.

DESCRIPTION OF THE DRAWINGS

These and other features and objects of this invention are more clearly discussed hereafter in association with the accompanying drawings, in which.

DESCRIPTION OF THE PREFERRED EMBODIMENTS

Figure 1:
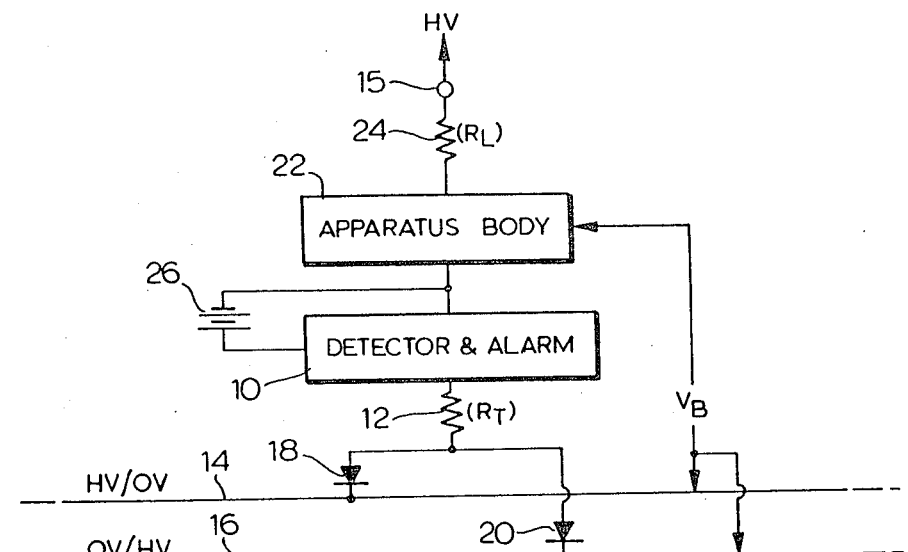
FIG. 1 is a general block diagram showing the relationship of this invention in a bi-polar circuit.
Figure 2:
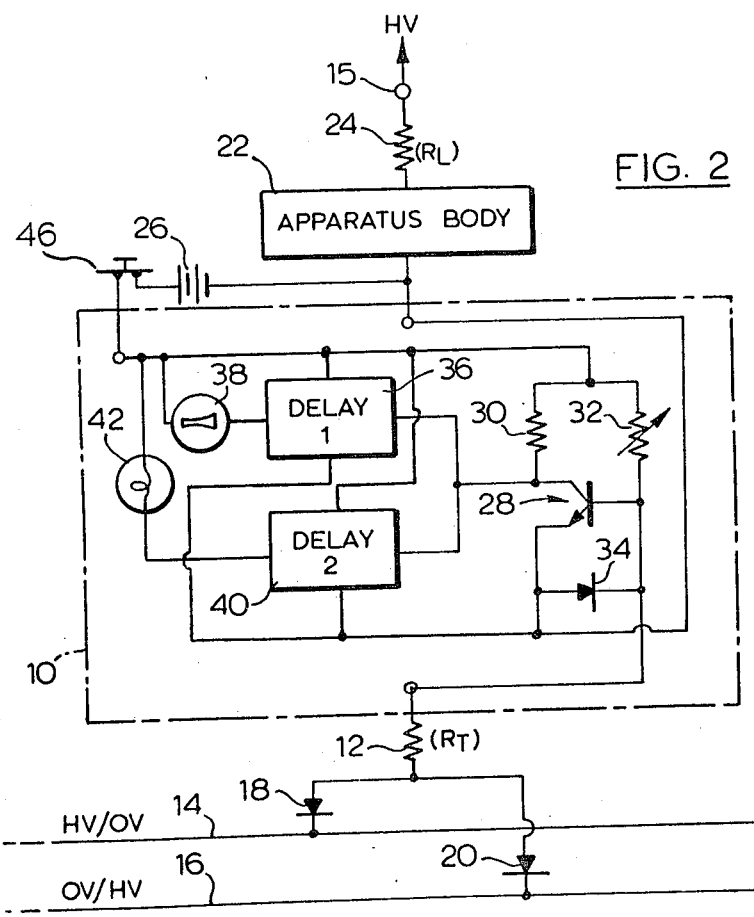
FIG. 2 is a circuit similar to that of FIG. 1 but more specific as to the major components of the detector and alarm circuitry according to this invention.

Apparatus according to this invention is shown diagrammatically in FIG. 1, and somewhat more specifically in FIG. 2 with respect to the major components of the detector and alarm circuits. Thus, there is shown in FIG. 1, a detector and alarm indicated generally at 10 in series with a resistor 12 which is connected to a pair of lines 14, 16 by a pair of back-to-back diodes 18, 20 respectively. It will be seen from more detailed discussion hereafter that resistor 12 is, at any instant in time, connected only to the most negative one of the pair of electric power lines 14, 16 when there is a voltage difference between them.

The detector and alarm circuitry 10, in accordance with this invention, is further connected in series with the chassis, body or other portion of the apparatus which might be contacted by a human who is at ground potential, and the apparatus body or other portion is shown generally at 22. It, in turn, is connected in series with the resistor shown at 24, which is connected to an electric power line 15. It will be noted in FIGS. 1 and 2 that resistors 12 and 24 are designated $R_T$ and $R_L$ respectively; and those resistors are respectively a known test resistance which is interposed between the apparatus body 22 by way of the detector and alarm circuitry 10 to the most negative one of the electric power lines 14, 16, and the incipient leakage resistance which may occur in the apparatus between the apparatus body 22 and the most positive of the electric power lines, shown at 15 in the drawings. A battery 26 is shown being connected across the detector and alarm circuit 10, and one terminal of the battery 26 is also connected to the apparatus body 22.

In any two wire trolley line installation, one of the electric power lines is nominally at ground potential or zero voltage; and the other of the electric power lines is at the nominal working voltage which is a high voltage relative to ground. The electric power lines are not, however, polarized so that one or the other of the lines is always the OV line or HV line, because of the manner in which such overhead lines are connected, particularly at road or line intersections and between separate line sections, etc. Thus, a pair of back-to-back diodes 18, 20 is provided; they are connected respectively to lines 14 and 16. It will be noted that lines 14 and 16 are designated HV/OV and OV/HV respectively; that is to say, when line 14 is the HV line, line 16 is the OV line and vice versa. Thus, the lower end of resistor 12 is connected either through diode 18 or diode 20 to whichever of lines 14 and 16 is the most negative line, at any instant in time. Because of the circuit arrangement within the apparatus in which the detector and alarm circuitry according to this invention is installed, the leakage resistance 24 is found between the chassis or body of the apparatus 22 and whichever of lines 14 and 16 is the most positive electric power line — which, for purposes of this discussion and ease of illustration, is shown as line 15 in the drawings. [It can be seen that, with appropriate circuit modifications which would be obvious, the arrangement shown in FIG. 1 can be an AC arrangement where the line sampling from the detector and alarm circuit 10 and resistor 12 is through diodes 18 and 20 to the most negative line, and the leakage resistance 24 is from the apparatus body 22 to the most positive line, at any instant in time.]

A resistance network exists between the most positive and most negative of the electric power lines to which the electric apparatus in which the detector and alarm circuitry according to this invention is installed; and that resistor network includes the leakage resistance from the apparatus body to the high voltage line which may be lumped and designated $R_L$, and is shown at resistor 24, and a known test resistor $R_T$ shown as resistor 12. The apparatus body 22 is, for purposes of this discussion, considered to be a short circuit — that is to say, a zero resistance element in the resistor string; and the resistance string connection within the detector and alarm circuitry 10 from the leakage resistance 24 to the known test resistance 12 is also a zero resistance component. Therefore, there is installed between the most negative electric power line and the most positive electric power line a known resistance and an unknown incipient leakage resistance, each of which is also connected to the body, chassis or other portion of the apparatus which a human might contact. It has been noted above that it is desirable that the apparatus body 22 be permitted to rise in voltage relative to the most negative electric power line (which is substantially at ground potential) to only about 30 volts; and that no condition be permitted where a short circuit current from the apparatus body to ground and connected through the leakage resistance 24 to the most positive of the electric power lines 15, may exceed 2 ma. That is to say, $V_B$ as shown in FIG. 1 may not exceed 30 volts relative to the most negative of electric power lines 14, 16; and the leakage current through the resistor string 24, 12 may not exceed 2 ma. Given those conditions, it can be seen that when the value of the known resistance 12 is 15K ohms, a current of 2 ma. through it causes a 30 volt drop across the known resistance. In a conventional trolley system, when the voltage between the electric power lines is 600 VDC, it will be seen that a total resistance which can be accommodated between the electric power lines is 300K, and any resistance lower than that would cause a current of greater than 2ma. to flow in the resistance string. Thus, because the known resistance 12 is 15K, a leakage resistance 24 of 285K can be tolerated in that circumstance.

When the leakage resistance, in the circumstances described above where the voltage between the electric power lines 14, 16 is 600 VDC, exceeds 285K, the current through resistance string 24, 12 does not exceed 2 ma. and the voltage drop across the known test resistance 12 does not exceed 30 volts. If, however, the leakage resistance 24 drops below 285K in the given circumstances, the current through the resistance string 24, 12 exceeds 2 ma., and the voltage drop across the known resistance 12 exceeds 30 volts. A potentially hazardous condition then exists, because a person who stands at ground potential and solidly connects to the apparatus body 22 would then be in series with the leakage resistance 24 to the HV line, and when the leakage resistance 24 has reduced to the extent that a current of approximately 2 ma. might flow through the persons body, the detector and alarm circuitry according to this invention becomes operative to warn of the incipient hazardous condition. This might be especially necessary in any condition when a sudden drop in leakage resistance 24 — even, perhaps, tending towards a short-circuit from the apparatus body 22 to the HV line 15 — would cause a dramatic rise in voltage $V_B$ of the apparatus body 22 with respect to the most negative of the electric power lines, i.e. substantially ground potential.

When the detector and alarm circuitry according to this invention is operating in conventional trolley coach arrangement, it may be necessary to provide time delays in the alarm circuitry to accommodate transient voltage swings on the electric power lines. Such transient voltage swings may occur during motor start up, particularly when several trolley coaches may be in the same section of line, or when the trolley coach is starting upwardly on an incline, or when the trolley coach passes through an isolating resistor between line sections thereby causing a temporary collapse in voltage or a reversal of polarity of voltage. In any of those circumstances, or under like conditions, the current through the resistance string 24, 12 may temporarily exceed 2 ma., but generally when such conditions exist the excess current subsides in a period of time shorter than 1 or 2 seconds. Thus, a delay circuit is included in the alarm circuitry according to this invention, which precludes indication of an alarm status for a predetermined period of time, which period of time may be adjusted. When apparatus according to this invention is installed in a trolley coach, it may often be desirable to give a first warning of an incipient hazardous condition to the driver or operator of the trolley coach, which warning would last one so long as the hazardous condition lasts, provided that such hazardous condition does not exist for a period of time in excess of several seconds. Thus, a second delay network may be provided in the alarm circuitry according to this invention, which initiates a further signal of alarm status to the operator or driver, but only after a period of, say, 5 seconds. However, if the second alarm status indication is initiated by the timing out of the second alarm delay circuitry, it may be assumed that the hazardous or fault condition is such that immediate action must be taken by the operator or driver of the trolley coach or other apparatus — such as, in the case of a trolley coach, by the driver or operator jumping clear of the coach and disconnecting it from the electric power lines, and then unloading the coach of all of its passengers. The first alarm might be a soft buzzer or other audible signal, which might only last for a second or two in the event of a fault condition lasting for a longer period of time than the first delay period, and the second signal might be an alarm bell or light which cannot be turned off, even upon removal of the fault condition or isolation of the apparatus from the electric power lines, without resetting the alarm circuitry.

Turning to FIG. 2, the detector and alarm circuitry 10, in accordance with this invention, is shown in greater detail, at least with respect to the major components thereof. The detector comprises a transistor 28 having a bias resistor 30 connected, in this case to its collector, and a resistor 32 connected to its base, with the upper ends of resistors 30 and 32 each connected to the positive rail of the battery 26. [As noted above, battery 26 may be a standby or lighting battery which would, in any event, be found in the apparatus; and would generally be of the lead-acid automotive type, nominally 12 volts.] The value of resistance 32 is chosen or adjusted so that transistor 28 is conductive and a current of approximately 2 ma. is drawn through resistor 32 and transistor 28 when no current flows through resistor 12. As current flows in resistor 12, the current flow through to resistor 32 backs off, until a point is reached when 2 ma. of fault current flows through resistor 12 from the apparatus body 22 and the leakage resistor 24. At that time, the base voltage on transistor 28 reduces to zero, and the transistor 28 is turned off. Diode 34 is provided for protection of transistor 28 if the voltage of the base of transistor 28 continues to rise with increased fault current through resistor 12.

In any event, the transistor 28 together with its bias resistor 30 and comparative resistor 32 provides a means for comparing the current through resistor 12 to the predetermined minimum current allowable (in this case, 2 ma.); and when the transistor 28 turns off when equivalence of currents through resistors 12 and 32 is reached and the base voltage on transistor 28 reduces to zero, the alarm circuitry is actuated.

As noted above, the alarm circuitry comprises at least one delay circuit 36, designated Delay 1, which may comprise a simple RC timing network and which may be adjustable. The decay period of the delay circuitry 36 may be in the order of one to two seconds, and the delay circuitry is arranged so that it begins to time out by way of capacitor discharge or othewise, in manners known to persons skilled in the art, immediately at the instant when transistor 28 opens. If, during the time period of delay circuit 36, the transistor 28 closes because the fault condition which has been sensed by it was transitory, the delay circuit 36 stops timing out and resets in preparation for the possibility of another fault condition. If, however, the delay circuit 36 goes to its limit of, say, 2 seconds, an alarm 38 which may be an audible alarm such as a buzzer is actuated. It should be noted that the output of the delay circuitry 36 is a following output; that is to say, if the fault condition ceases before delay circuitry 40 discussed hereafter becomes effective, actuation of the alarm indicator 38 also ceases.

If the alarm status continues for the full period or decay time of delay circuitry 40, designated Delay 2, which may be, say, 5 seconds, a further alarm status signal is given such as a visual signal from lamp 42. In this case, however, delay circuitry 40 may include a latching element such as an SCR or thyristor, so that the output of delay circuitry 40 is a latching output and the alarm signal indicator 42 cannot be turned off without resetting the latching element. A reset button 46 is provided which is normally on. The reset button is pulled out to break electrical contact with the positive rail of battery 26 and thereby reduce the voltage of the circuit to zero to permit the thyristor latching mechanism to turn off and in turn, switch off lamp 42.

Figure 3:
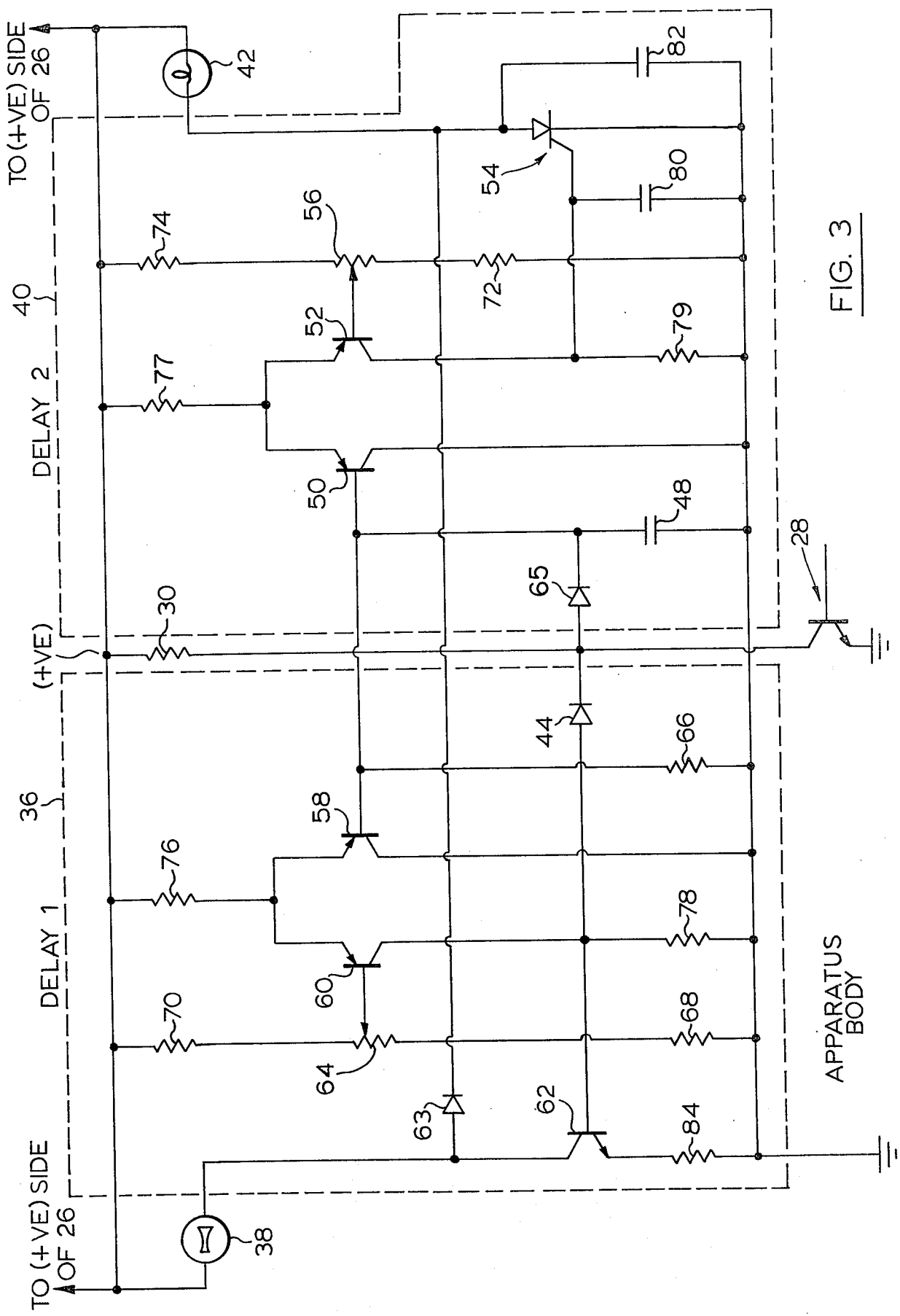
FIG. 3 is a schematic circuit diagram showing the electrical circuitry of DELAY 1 and 2 in FIG. 2.

Turning to FIG. 3, the details of the circuitry components of Delays 1 and 2 are shown. Unmarked circuitry components of the circuit of FIG. 3 are understood to be standard circuit elements used in association with the components which are marked. The circuit is set up in a manner such that the most positive point in the circuitry is at the upper portion of the drawing and the most negative portion of the circuitry is at the bottom of the drawing.

As discussed, when the base voltage of transistor 28 is reduced to zero, transistor 28 is turned off. Capacitor 48 begins to charge as current now flows into the capacitor. The rate at which capacitor 48 charges is dependent upon the magnitude of resistor 30. As the voltage across capacitor 48 increases, the voltage eventually reaches a point in Delay 1 where the voltage present at the base of transistor 58 is adequate to turn transistor 58 off. When transistor 58 turns off, then transistor 60 begins to conduct to cause a positive voltage to be present on its collector. This positive voltage swing on the collector of transistor 60 is sensed by the base of transistor 62 to turn on transistor 62 at a desired positive voltage as determined by resistor 78 and provide a ground path for audible device 38. Potentiometer 64 is set to establish a reference voltage of the differential pair of transistors 58 and 60 such that transistor 62 is turned on as discussed above within for example, 2 seconds after the hazardous condition occurs. If the alarm condition subsides, for example within 4 seconds or so, then transistor 28 is turned back on thereby taking away the positive base drive on transistor 62 through diode 44 to turn transistor 62 off. The audible alarm 38 is thereby turned off. Diode 44 prevents transistor 62 being turned on while transistor 28 is turned on.

Regarding the circuitry of Delay 2, as the voltage on capacitor 48 increases, the voltage present at the base of transistor 50 is adequate to cause transistor 50 to stop conducting. When transistor 50 is turned off, transistor 52 begins to conduct and in turn, cause a positive voltage to be present on its collector. This positive voltage is in turn sensed by the gate of thyristor 54 and the thyristor is latched on at a desired positive voltage determined by resistor 79 to provide a ground path for lamp 42. When lamp 42 turns on, this indicates to the operator of the bus that an extended alarm status or hazardous condition exists where the voltage of the apparatus body has risen above 30 volts with a current of 2 ma. flowing through resistor 12.

The precise time at which transistor 52 switches on is a function of the voltage present on capacitor 48 and by the setting of potentiometer 56. As mentioned, the charging rate of capacitor 48 is determined by the magnitude of resistor 30, in accordance with standard capacitor-resistor charging networks. The potentiometer 56 is set to establish the reference voltage of the differential pair of transistors which voltage is compared to the voltage on capacitor 48 to turn on transistor 52 at the correct time. In such a manner, Delay 2 can be set to signify an alarm status in, say, 5 seconds after the hazardous condition initially appeared and audible alarm 38 has already sounded. As soon as thyristor 54 is latched, it remains on so that lamp 42 is illuminated until the circuit is reset by pulling out pushbutton 46. The audible alarm 38 has its grounded side connected to the anode of the thyristor 54 through a diode 63. When thyristor 54 is latched on it thereby provides an alternate ground path for audible alarm 38 so that audible alarm 38 remains turned on when lamp 42 is turned on. The coach operator therefore has two warning systems which remain turned on until the circuitry is reset by pulling out button 46, even though the hazardous condition on the coach body may have subsided.

Diode 65 is provided to set up a "pumping action in the charging of capacitor 48 when there is essentially an on/off alarm condition. It also, in turn, prevents any charge which has accumulated in capacitor 48 from discharging directly back through to ground; instead, the capacitor 48 is forced to discharge through resistor 66 to ground. The magnitude of resistor 66 is chosen to provide a very long discharge time for capacitor 48 such as up to 10 to 15 seconds. As a result, if the coach body continues to fluctuate from an uncharged to charged condition, within a short time, then the charge of capacitor 48 is built up and may reach a level to activate audible alarm 38.

Resistors 68 and 70 improve the resolution of the setting of potentiometer 64 so as to provide a more finely-tuned adjustment of the potentiometer. Similarly, resistors 72 and 74 permit a fine adjustment of potentiometer 56.

One such differential pair of transistors 58, 60 and 50, 52, emitter resistors 76, 77 are provided in accordance with standard practice to limit current flow and to protect transistors 58, 60 and 50, 52.

In order to prevent the false triggering and latching of thyristor 54, capacitors 80 and 82 are provided in accordance with standard practice.

Resistor 84 is provided to limit the flow of current through transistor 62 to a predetermined number of milliamperes.

With the exemplary circuitry shown in FIG. 3 for Delays 1 and 2, the circuitry functions in a manner so that after a hazardous condition on the coach body is sensed, the timing of Delay 1 is such that an audible alarm is sounded 2 seconds after the sensed condition. Delay 2 is timed such that if the hazardous condition continues for more than 5 seconds, a visual alarm is turned on with the audible alarm, both alarm signals being locked on until the circuitry is reset. In this manner, the coach operator has a positive indication of an extended hazardous condition on the coach body.

As previously discussed, subsequent to relieving the alarm condition from the coach body, the circuitry of Delays 1 and 2 may be reset by pulling out normally-closed button 46. This in turn reduces the voltage in the circuitry to zero, thereby turning thyristor 54 off.

It has been noted above that the detector and alarm circuits according to this invention may be adapted to AC operation, as well as for DC operation, provided the body or other portion of the apparatus containing the detector and alarm circuitry is isolated from ground and one of the electric power lines to which the apparatus is connected, is nominally or substantially at ground potential. The values for resistances and voltages which have been discussed above are typical of a trolley coach installation, and other values and parameters may be chosen in different circumstances. Various alterations and different circuit arrangements can be made and specific delay circuitry or detector circuitry substituted, without departing from the spirit of the invention or the scope of the appended claims.

I claim:

1. For use in electric apparatus which is connected to at least two electric power lines from which power for said apparatus is derived, where the body or other portion of said apparatus which might be contacted by humans who are at ground potential is insulated from ground, improved detector and alarm apparatus for detecting the presence of leakage resistance between said body or other portion and the most positive of said electric power lines and for initiating an alarm status when said leakage resistance falls to a predetermined level, comprising:
   a known resistance interposed between said apparatus body or other portion and the most negative one of said electric power lines and in series with said leakage resistance;
   detector means for sensing the flow of current through said known resistance; and
   an alarm circuit for signaling an alarm status when current flow through said known resistance above a predetermined minimum current level is sensed; where
   the value of said known resistance is chosen so that the current flow through it would exceed said predetermined minimum current if the voltage of said apparatus body or other portion with respect to the most negative of said electric power lines exceeds a predetermined minimum voltage;
   said detector means comprises means for sensing the flow of current in said known resistance, and means for actuating said alarm means when said sensed current in said known resistance reaches said predetermined minimum current level; and
   said known resistance being connected between said apparatus body or other portion and the most negative of said electric power lines by back-to-back diodes, each diode with its positive end current to the end of said known resistance remote from said apparatus body or other portion, and with its negative end connected to one of said electric power lines;
   said alarm circuit includes first timer means actuable by said detector circuit means to preclude an alarm for a first predetermined period of time, and to permit an alarm after said first predetermined period of time if said sensed current is and has remained at least at said predetermined minimum current level for said first predetermined period of time; and
   second timer means actuable by said detector circuit means to preclude an alarm for a second predetermined period of time longer than said first predetermined period of time, and to permit a further alarm indication after said second predetermined period of time if said sensed current is and has remained at least at said predetermined minimum current level for said second predetermined period of time.

2. The leakage resistance detector and alarm circuit of claim 1, where the output of said first timer means is a following output which tends to collapse if the sensed current through said known resistance falls below said predetermined minimum current level while said output from said first timer means is on; and where the output of said second timer means is a latched output which remains on until reset, independently of the further presence of current through said known resistance at least at said predetermined minimum current level.

3. The leakage resistance detector and alarm circuit of claim 2, where the output of said second timer means is connected to the output of said first timer means so that, when said output of said second timer means is on, the output of said first timer means is also latched on.

4. The leakage resistance detector and alarm circuit of claim 1, where said detector means comprises a circuit including at least one transistor which is conductive when no current flows through said known resistance, and at least one resistor connected to said known resistance and to the base of said at least one transistor at one end and to a source of voltage at its other end, where the value of said further resistor is such that when current through said known resistance reaches said predetermined minimum current level, the voltage of the base of said transistor reaches a level that said transistor becomes non-conductive; and where said timer means is connected to said detector circuit so as to begin timing when said transistor becomes non-conductive.

5. The leakage resistance detector and alarm circuit of claim 3, where the alarm which is initiated after said first predetermined period of time is an audible alarm and where the alarm which is initiated after said second predetermined period of time is a visual alarm.

* * * * *